US006558512B2

(12) United States Patent
Ueno et al.

(10) Patent No.: US 6,558,512 B2
(45) Date of Patent: *May 6, 2003

(54) BASE MATERIAL FOR LAMINATE AND PROCESS FOR PRODUCING THE SAME

(75) Inventors: Hiroyoshi Ueno, Nakatsugawa (JP); Yoshihisa Kato, Nakatsugawa (JP); Isao Ichioka, Nakatsugawa (JP); Takekazu Adachi, Nakatsugawa (JP); Mamoru Murata, Nakatsugawa (JP); Hirokazu Hiraoka, Hikone (JP); Manabu Ochida, Hikone (JP); Masayuki Noda, Hikone (JP)

(73) Assignees: Oji Paper Co., Ltd., Tokyo (JP); Shin-Kobe Electric Machinery Co., Ltd, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/441,135

(22) Filed: Nov. 17, 1999

(65) Prior Publication Data

US 2002/0197466 A1 Dec. 26, 2002

(30) Foreign Application Priority Data

Nov. 18, 1998 (JP) ............................................ 10-328242

(51) Int. Cl.[7] ................................................ B32B 31/20
(52) U.S. Cl. ....................... 162/123; 162/132; 162/135; 162/146; 162/206; 162/225; 156/62.2
(58) Field of Search ................. 442/59, 327; 428/474.4; 156/62.2; 162/123, 132, 135, 146, 206, 225

(56) References Cited

U.S. PATENT DOCUMENTS

| 4,578,308 A | * | 3/1986 | Hani et al. .................. 428/464 |
| 4,729,921 A | * | 3/1988 | Tokarsky ..................... 162/146 |
| 5,002,637 A | | 3/1991 | Toyoshima et al. |
| 5,089,088 A | * | 2/1992 | Hendren et al. ............ 162/123 |
| 5,173,359 A | | 12/1992 | Toyoshima et al. |
| 5,314,742 A | | 5/1994 | Kirayoglu et al. |
| 5,783,039 A | | 7/1998 | Murayama |
| 5,948,543 A | * | 9/1999 | Ootuka et al. .............. 428/474 |

FOREIGN PATENT DOCUMENTS

| EP | 0 467 286 | 1/1992 |
| EP | 0 807 703 | 11/1997 |
| EP | 0 915 125 | 5/1999 |
| JP | 4-6708 | 1/1992 |
| JP | 8-199494 | 8/1996 |
| JP | 9-228289 | 9/1997 |
| WO | WO 95/19466 | 7/1995 |

OTHER PUBLICATIONS

Patent Abstracts of Japan, vol. 1998, No. 13, Nov. 30, 1998, JP 10–212688, Aug. 11, 1998.

* cited by examiner

Primary Examiner—Sam Chuan Yao
(74) Attorney, Agent, or Firm—Oblon, Spivak, McClelland, Maier & Neustadt, P.C.

(57) ABSTRACT

The present invention is to provide a base material for a laminate having a high strength, reduced thickness, and light weight. In the present invention, a base material is prepared by incorporating a thermosetting resin binder into a non-woven fabric of para-aramid fibers prepared by a wet type paper making, and then heating a plurality of the resultant non-woven fabric sheets under pressure. The non-woven fabric sheet comprises 95 to 70 mass % of the para-aramid fibers and 5 to 30 mass % of the thermosetting resin binder.

6 Claims, No Drawings

BASE MATERIAL FOR LAMINATE AND PROCESS FOR PRODUCING THE SAME

DETAILED DESCRIPTION OF THE INVENTION

1. Technical Field to which the Invention Belongs

The present invention relates to a base material for a laminate produced by laminating non-woven fabric sheets mainly comprising organic fibers, and a process for producing it. The present invention further relates to a prepreg and a laminate obtained from the base material for a laminate.

2. Prior Art

Recently, a smaller size and a higher function are required of electronic equipments and, accordingly, printed boards of a high wiring density are now the mainstream, components to be mounted are being changed from those of insertion type to those of surface attachment type, and the mounting method is now mainly the surface mounting method.

In this method, the connection reliability between components such as chips to be mounted on the surface and a printed board is an important problem. Namely, the coefficients of thermal expansion of both of them must be made as close to each other as possible.

The coefficient of thermal expansion of chips of thin surface mounting type is $5 \times 10^{-6}/°C.$, while that of a base material obtained by impregnating a non-woven glass fabric with an epoxy resin is about three times as high as this value.

Further, the dielectric constant is also to be taken into consideration. The dielectric constant of ordinary FR-4 is about 4.7 to 5.1. Such a relatively high dielectric constant causes the reduction of the velocity of propagation of the electric pulse of an adjacent signal circuit to cause a serious signal delay. Because the delay by the signal propagation in the printed boards will be very serious in future, a base material for a laminate of a low dielectric constant will be necessitated. FR-4 is a copper-clad laminate for printed board obtained by impregnating a glass fabric base material with an epoxy resin and laminating them NEMA (National Electrical Manufacturers association) standards.

Under these circumstances, investigations are made on a laminate produced by using a non-woven fabric of para-aramid fibers having a negative coefficient of heat expansion and a low dielectric constant to be used as a laminate using a base material for a printed board.

A typical example of such a base material is disclosed in Japanese Patent Publication for Opposition Purpose (hereinafter referred to as "J. P. KOKOKU") No. Hei 5-65640 (U.S. Pat. Nos. 4,698,267 and 4,729,921). The publication discloses a base material produced by mixing p-phenylene terephthalamide fiber flocks with m-phenylene isophthalamide fibrids, making sheets from the obtained mixture and then compressing the sheets under heating.

A printed board produced by impregnating the base materials obtained as described above, with an epoxy resin and laminating them has a coefficient of heat expansion far lower than that of a laminate produced by using an ordinary non-woven glass fabric as the base material, because the base material having a negative coefficient of heat expansion is impregnated with the epoxy resin having a positive coefficient of heat expansion, and accordingly, they compensate the coefficients thereof each other. Therefore, such a printed board is suitable for boarding very small chips having many pins such as CSP (stand for "chip size pakage"), and also for portable equipments required to be small and light in weight.

However, it is demanded to further reduce the size and weight of the electronic appliances and also to further improve the function thereof and, accordingly, the semiconductor chips to be mounted are demanded to be smaller, and the increase in number of the pins is also demanded. As a matter of course, it will be indispensable for the printed boards, on which they are to be mounted, that they are usable for a higher density wiring. Further, it will be demanded that the printed board itself is thinned and reduced in weight for the purpose of reducing the weight of the electronic appliances.

A laminate produced by impregnating the above-described base material with an epoxy resin and pressing the base material has a low dielectric constant and a coefficient of linear expansion close to that of bare chips and, accordingly, it is supposed that an excellent performance can be obtained by using it for interposers such as CSP. However, the thickness of the laminate must be further reduced in this case.

To obtain the base material for a printed board and a laminate satisfying the above-described requirements, the investigation of only the fibrous materials is no more sufficient. Namely, it is demanded that the orientation of the fibers in the non-woven fabric base material in the machine direction is only slight and that the uniformity of the basis mass (mass per 1 $m^2$) and the fiber orientation is high.

To make the laminates thin, it is also necessary to make the base material thin as a matter of course. In such a case, a high tensile strength, particularly, a high tensile strength when immersed in a solvent such as acetone or MEK, is required of the base material. Further, it is important to suitably adjust the density of the base material.

Reasons why the above-described, three conditions are required of the base material will be described below.

In the high-density wiring, the copper foil patterns are extremely narrow, and the copper foil is now being made thinner for reducing the weight of the printed board. Therefore, the wires are easily broken by the warp and torsion of the printed board. In addition, because the distances between the copper foil patterns are narrowed, the precision of the patterns must be more improved.

However, when the fibers of the base material are strongly oriented in the machine direction (hereinafter referred to as "MD") of the sheet, the effect of the aramid fibers which control the heat expansion of the printed board by its negative heat expansion is not exhibited in the cross direction of the base, and the heat expansion in a direction (cross direction; hereinafter referred to as "CD") rectangular to the flow of the sheet becomes high. When the fiber orientation is irregular, the warp and torsion of the printed board easily occur.

When the distribution of the basis mass of the base material is wide, the distribution in the density after the heat treatment under pressure is also wide, and the epoxy resin content is not uniform and it varies depending on the sites. On the other hand, in the printed board produced from the aramid fiber base material, the thermal expansion is kept low by the combination of the material having a negative coefficient of heat expansion and the material having a positive coefficient of heat expansion. As a result, when the epoxy resin content varies, the coefficient of heat expansion of the printed board varies to increase the distribution in the dimension caused by the heat in the step of producing the printed board or, in other words, to lower the accuracy of the copper foil pattern.

In the production of the laminate, the base material must be impregnated with an epoxy resin and then dried to obtain a prepreg coated with the semi-cured resin. In this step, the base material is subjected to a high tension because it is immersed in a solvent for the epoxy resin, such as acetone or MEK, and then the excessive resin is scraped off. Thus, the base material must have a strength resistant to such a high tension while it is immersed in the solvent. Hereinafter, this strength is referred to as "solvent-resistant strength". When the base material is thin, its strength is reduced as a matter of course, and the production of the base material durable in the prepreg-producing step is thus difficult.

In addition, when the base material has a low strength, a sufficient tension cannot be applied to it, because it is easily broken even when it has a certain thickness. In such a case, the production velocity is lowered to reduce the production efficiency.

When the density of the base material is unsuitable, the following defects are caused. When the density is excessively high, the impregnation with epoxy resin is insufficient in the production of the prepreg to form the prepreg having an insufficient resin content. When the laminate is produced from such a prepreg, portions not impregnated with the resin, which are called thin spots or voids, are formed due to an insufficient resin flow in the pressing step, and distribution in amount of the resin which can be macroscopically recognized is caused.

On the other hand, when the density is insufficient, the resin flow in the pressing step is excess. Namely, a force to be applied to the base material in the pressing step is increased by the flow of the resin and the dimensional change in this step is increased.

As described above, although the base material for a laminate, mainly comprising para-aramid fibers, is suitable for the portable equipments because it is suitable for the mounting of small chip elements such as CSP, it is yet insufficient for high-density wiring which is now being developed, in the orientation of the fibers and the uniformity of the basis mass. Further, the strength of the base material must be further improved so that the laminate itself can be reduced in weight and the base material can be suitable for the CSP interposer.

[Problem to be Solved by the Invention]

Accordingly, the present invention is to provide a base material for a laminate having a high strength, reduced thickness, and light weight.

[Means for Solving the Problem]

After intensive investigations made for the purpose of resolving the above problem, the present inventors have found that the above-described problem can be resolved by a base material for a laminate comprising a plurality of non-woven fabric sheets which are heated under pressure so that they are integrated, the non-woven fabric sheet comprising (1) a non-woven fabric constituted of para-aramid fibers and prepared by wet type paper making process and (2) a thermosetting resin binder incorporated into said non-woven fabric. In the base material of the present invention, a suitable fiber orientation and a uniform basis mass can be obtained. Therefore, the base material has a sufficient strength when it is formed into a prepreg. In addition, the base material of the present invention can have a uniform density suitable for a printed circuit board.

The present inventors have also found that even when a thermosetting resin binder contained in the non-woven fabric sheets is heated in a step of drying the non-woven fabric sheets by heat, in the course of the process for producing the non-woven fabric sheets, the resin can be again softened and made adhesive by heating it to a temperature higher than the drying temperature +30° C. in the drying step. Namely, the present inventors have found that the thermosetting resin can be used for the lamination by heating it with, for example, a hot roll of a temperature higher than a certain, predetermined temperature under pressure. The present inventors have further found that the laminate of the non-woven fabric sheets produced by heating them under pressure and having a suitably controlled density has a high solvent-resistant strength, because the thermosetting binders have been sufficiently cured, and also that the laminate has a uniform basis mass and only a slight warp, because it is produced by laminating a plurality of thin non-woven fabric sheets having a low basis mass, even though the fiber orientation in MD is low. The present invention has been completed on the basis of these findings.

Therefore, the present invention relates to the following inventions.

1. A base material for a laminate comprising a plurality of non-woven fabric sheets which are heated under pressure so that they are integrated, said non-woven fabric sheet comprising (1) a non-woven fabric constituted of para-aramid fibers and prepared by wet type paper-making process and (2) a thermosetting resin binder incorporated into said non-woven fabric, said non-woven fabric sheet composed of 95 to 70 mass % of said para-aramid fibers and 5 to 30 mass % of said thermosetting resin binder based on the total weight of said para-aramid fibers and said thermosetting resin binder.

2. A process for producing a base material for a laminate comprising the steps of:
   1) incorporating a thermosetting resin binder into a non-woven fabric prepared by a wet type paper making process and constituted of para-aramid fibers, to prepare a non-woven fabric sheet; and
   2) heating a plurality of said non-woven fabric sheets under pressure.

[Embodiments of the Invention]

The non-woven fabric used in the present invention is obtained by forming a sheet by the wet type paper or sheet-making method (hereinafter referred to simply as "wet type paper-making method"). In the wet type paper-making method, a non-woven fabric is formed from a dispersion wherein para-aramid fibers are dispersed in a medium such as water. In the present invention, the non-woven fabric may be used as it is in a wet state or it can be dried by heating it. It is suitable that the para-aramid fibers in the dispersion is used in an amount of 0.1 to 1.0 mass %, preferably, 0.15 to 0.8 mass % based on the dispersion.

The non-woven fabric sheet used in the present invention is prepared by incorporating a thermosetting resin binder into the resultant non-woven fabric as stated above. The method for incorporating the thermosetting resin binder into the non-woven fabric is not limited, but for example, includes various methods, such as a method of adding the thermoplastic resin binder to a slurry of para-aramid fibers; or a method of spraying, coating or impregnating a thermoplastic resin binder to the non-woven fabric in a wet state or in a dried state.

The non-woven fabric sheet may be heated under pressure in a wet state as explained later, or may be heated under pressure after drying it. The wet non-woven fabric sheet may be comprised of a single layer or a laminate of two or more sheets. For example, a plurality of the non-woven fabric sheets may be laminated to form a laminated non-woven fabric sheet, which will be then heated under pressure.

The base material for a laminate used in the present invention is a sheet produced by laminating a plurality of the non-woven fabric sheets and heated under pressure using, for example, a hot roll.

In the present invention, the prepreg is a sheet to be used for the production of the laminate, which is produced by impregnating the base material for a laminate with a thermosetting resin and drying it.

In the present invention, the laminate is obtained by heating two or more prepregs together under pressure. If necessary, one or both of the surfaces of the prepreg may be coated with a metal foil. The laminate also includes a so-called multilayer product having a printed inner layer and a printed surface layer.

The fiber orientation angle used herein indicates an angle obtained by determining the attenuation of microwaves of the sheet by a method of determining the fiber orientation of fiber sheets described in J. P. KOKOKU No. Sho 63-60336, and representing the angle made by the direction in which the attenuation of microwaves is the maximum with the machine direction.

The average of the fiber orientation angle used herein indicates the average of the fiber orientation angles determined at 10 points in MD (machine direction) and also at 10 points in CD (cross direction) (total: 10×10=100 points).

The distribution σ in the fiber orientation angle used herein indicates the distribution in the fiber orientation angle at the above 100 points.

The longitudinal/transverse ratio of fiber orientation used herein is determined by determining the attenuation of microwaves of the sheet by a method of determining the fiber orientation of fiber sheets described in J. P. KOKOKU No. Sho 63-60336, determining the ratio of the attenuation in the longitudinal direction (MD) to that in the transverse direction (CD) at 10 points in MD and also at 10 points in CD (total: 10×10=100 points), and calculating the average.

The apparatuses for determining the molecular orientation with microwaves are concretely those described in J. P. KOKOKU No. Sho 63-60336 such as a molecular orientation meter MOA-2012A (a product of Oji Keisoku Kiki Co., Ltd.).

The longitudinal/transverse ratio (T/Y ratio) of the fiber orientation of the base material for a laminate is in the range of 0.8/1 to 2.4/1.

When the T/Y ratio is below 0.8/1, the basis mass is often ununiform and the range of the distribution of the fiber orientation angle is wide.

When the T/Y ratio exceeds 2.4, the orientation of the fibers in MD is strong and that in CD is weak and, therefore, the coefficient of heat expansion in MD is easily increased. On the contrary, when the T/Y ratio is below this range, the uniformity of the fiber orientation is damaged to cause the warp and torsion. In addition, in such a case, the uniformity of the basis mass is reduced to increase the distribution of the dimensional change due to the heat in the printed board-producing step.

The base material for a laminate produced by the process of the present invention is capable of easily attaining the fiber orientation in the above-described, preferred range, because it has a laminate structure obtained by laminating the non-woven fabric sheets. Thus, the base material has a uniform coefficient of heat expansion and is hardly warped or twisted.

The base material for a laminate of the present invention preferably has an average fiber orientation angle in the range of, for example, −30° to +30°, preferably −10 to +10°, and a distribution σ in the fiber orientation angle of not larger than 27°, preferably 20° or less.

The para-aramid fibers used in the present invention are fibers of an alternating copolymer of an aromatic diamine wherein the amino group is in a p-position and an aromatic dicarboxylic acid wherein the carboxyl group is in a p-position, such as fibers of poly(p-phenyleneterephthalamide) or poly(p-phenylenediphenyl ether terephthalamide). The para-aramid fibers preferably have a diameter of 5 to 15 μm, and a length of 1 to 6 mm.

The smaller the diameter of the para-aramid fibers, the better for increasing the number of the interlocking portions in the non-woven fabric sheets and for increasing the strength of the non-woven fabric sheet. The diameter of the para-aramid fibers is selected substantially in the above-described range taking also the dispersibility and filterability of the slurry in the sheet-forming step into consideration. Also, the longer the para-aramid fibers, the better for increasing the number of the interlocking sites and for the strength of the non-woven mixed fabric. However, on the other hand, the shorter the fiber length, the better for the dispersibility of the slurry in the sheet-forming step. Thus, the fiber length is selected substantially in the above-described range.

The thermosetting resin binders usable in the present invention are preferably epoxy resin, acrylic resin, melamine resin, phenolic resin, etc. The thermosetting resin binders are, however, not limited to them. A mixture of these thermosetting resin binders is also usable.

When the thermosetting resin binder is sufficiently heated and then sufficiently cured, a high solvent-resistant strength can be obtained and the binder is no more softened even when it is heated. However, when the binder is heated to a temperature at least 30° C. higher than the drying temperature (usually 100 to 250° C., preferably 140 to 200° C.) in a drying step in an ordinary non-woven fabric production, it is softened to exhibit its adhesive power. A reason for this phenomenon is supposed to be that when the temperature is substantially equal to the drying temperature in the drying step in the ordinary non-woven fabric production, uncured components still remain.

The amount of the thermosetting resin binder is preferably 5 to 30 mass %, preferably 5 to 25 mass %, based on the total mass of the para-aramid fibers and the thermosetting resin binder in the non-woven fabric sheet. When the amount of the thermosetting resin binder exceeds 30 mass %, hot rolls for heat treatment under pressure are seriously stained to make the heat treatment under pressure difficult. On the contrary, when it is below 5 mass %, the solvent-resistant strength cannot be maintained and the laminating strength cannot be obtained to make the lamination impossible.

The fibers in the base material for a laminate of the present invention can be more firmly fixed to each other and the base material having a higher solvent-resistant strength can be obtained by incorporating thermoplastic resin fibers having a softening temperature of not lower than 220° or thermosetting resin fibers having a glass-transition temperature of not lower than 120° thereinto.

The thermoplastic resin fibers and the thermosetting resin fibers thus incorporated are once softened in the paper-making step and/or the compression step under heating to adhere the para-aramid fibers or the fibrous binders to each other. The thermoplastic resin fibers and the thermosetting resin fibers herein include the fibers in the form of chopped strands and pulp-shaped fibers containing fine fibrils.

The thermoplastic resin fibers are preferably m-phenylene isophthalamide fibers, phenolic resin fibers, polyarylate fibers, polyphenylene sulfide fibers, polyimide fibers and polyether ether ketone fibers. On the other hand, as the thermosetting resin fibers, for example, uncured phenolic resin is preferred.

The amount of the thermoplastic resin fibers and the thermosetting resin fibers is desirably 3 to 300 mass %, preferably 3 to 100 mass %, based on the total mass of the para-aramid fibers and the thermosetting resin binder. When the amount is below 3 mass %, the intended effect cannot be obtained and, on the contrary, when it exceeds 300 mass %, the tools are easily stained in the compression treatment under heating.

As for the shape of the thermoplastic resin fibers and the thermosetting resin fibers, the fiber diameter is preferably 5 to 15 µm, and the fiber length is preferably 1 to 6 mm. The smaller the fiber diameter, the larger the number of the interlocking sites of the fibers in the non-woven fabric sheet, and the better for the strength of the non-woven fabric sheet. However, the fiber diameter is selected substantially in the above-described range, also taking the dispersibility and filterability of the slurry in the paper-making step into consideration. The longer the fibers, the better for increasing the number of the interlocking sites of the fibers and for obtaining a high strength of the non-woven fabric sheet. On the contrary, the shorter the fiber, the better from the viewpoint of the dispersibility in the slurry in the sheet-forming step. Thus, the fiber length is selected substantially in the above-described range.

In case where the thermoplastic resin fibers and the thermosetting resin fibers are in the form of a pulp, they are usually produced by the fibrillation with an ordinary beating machine.

When such thermoplastic resin fibers are contained, the preferred temperature of the compression treatment is not higher than the melting point of the thermoplastic resin fibers +60° C.

The base material for a laminate of the present invention may be prepared by laminating a plurality of the non-woven fabric sheets and then heating under pressure. The heating temperature is preferably a temperature at least 30° C. higher than a drying temperature in the paper-making step and lower than 400° C. Specifically, the temperature is as described above.

In the compression step of the laminated non-woven fabric sheets, the thermosetting resin binder is re-melt and the non-woven fabric sheets are bound each other. It is preferable that the compression is carried out by hot rolls. In this case, the roll pressure as a line pressure is usually 50 to 300 kg/cm.

An additional heating step may be provided prior to the heat treatment under pressure.

As a specific embodiment, for example, a base material for a laminate may be prepared by forming a non-woven fabric by a wet type paper-making process, adding a thermoplastic resin binder to it, drying the resultant non-woven fabric sheet, laminating a plurality of the non-woven fabric sheets, and then heating the laminate under pressure by rolls.

Alternatively, the base material may be prepared by laminating a plurality of non-woven fabric sheets in a wet state and heating the laminate under pressure with hot rolls.

The non-woven fabric used in forming the non-woven fabric sheet may be prepared in a multi-layer non-woven fabric sheet by using a so-called multi-layer paper-making method. For example, a multi-layer non-woven fabric sheet may be prepared by through an inlet of an inclined wire machine or a cylinder machine.

The dry non-woven fabric sheet may be prepared by laminating a plurality of the non-woven fabrics prepared by the above multi-layer paper-making method, adding the thermosetting resin binder to the resultant laminate in a wet state, and then drying by heat the resultant laminate on the paper-making machine.

The non-woven fabric sheet may also be prepared by laminating a plurality of the non-woven fabrics in a wet state and drying the resultant laminate, to form a laminated dry sheet.

The density of the base material is not particularly limited in the present invention, and is suitably selected depending on the kind of the resin used for the impregnation in the course of the preparation of the prepreg, and the use thereof. The density is preferably in the range of about 0.5 to 0.8 g/cm$^3$, preferably 0.55 to 0.75 g/cm$^3$.

The density of the non-woven fabric sheet can be controlled by heating it under pressure. When the density is excessively high, a heating step may be provided before the heat-treatment under pressure to suitably cure the thermosetting resin and thereby to reduce the density. The heating method in the heating step is not particularly limited so far as no pressure is to be applied. The non-woven fabric sheet is usually heated in a hot air drying zone or by using an infrared heater.

On the contrary, when the density is excessively low, the amount of the thermosetting resin binder is increased. In this case, the amount of the thermosetting resin binder is preferably not larger than 30 mass % based on the total mass of the para-aramid fibers and the thermosetting resin binder constituting the non-woven fabric sheet as described above. A sufficiently high density can be obtained with the binder in an amount in this range.

The heat treatment under pressure is conducted by, for example, passing the non-woven fabric sheet through a pair of hot rolls.

In this step, the non-woven fabric sheets containing the thermosetting resin binder are passed at the same time through the hot rolls having a temperature at least 30° C. higher than the drying temperature in the production of the non-woven fabric sheet, to laminate them. When the temperature of the hot rolls is lower, the sufficient adhesive power of the thermosetting resin binder cannot be exhibited to make the lamination impossible. In such a case, the solvent-resistant strength cannot be obtained because the thermosetting resin is not sufficiently cured. When the roll temperature is above 400° C., the thermosetting resin binder is deteriorated by heat to lower the strength.

The number of times of the heat treatment under pressure is not limited to once, but two or several times are also possible.

The prepreg is obtained by impregnating the base material of the present invention with a thermosetting resin varnish and drying it by heat. Although the resin used for the impregnation is usually an epoxy resin, any of resins usually used for the laminates such as a phenolic resin and polyimide resin is suitably selected and used.

The laminate is produced from the prepreg of the present invention as will be described below.

A copper foil is placed on each of both surfaces of the prepreg obtained by the present invention. They are then molded by heat under pressure to cure the semi-cured resin contained in the prepreg and also to fix the copper foil. In producing the printed board, a circuit pattern is formed on the copper foil by an ordinary method and the circuit is formed by the etching. A multi-layer board is produced by placing the copper foil through the prepreg on each of both surfaces of the printed board and they are molded by heat under pressure to unify the whole. The copper foils on the surface or surfaces are etched in the same manner as that described above to form the circuits. The pressing method is not particularly limited, and is suitably selected depending on the properties of the resin used for the impregnation.

EXAMPLES

The following Examples will further illustrate the present invention, which by no means limit the scope of the present invention.

The properties or features given in the following Examples and Comparative Examples are determined or calculated as follows.

CV (a value obtained by dividing the standard deviation by the average and multiplying the obtained value by 100) of the basis mass was calculated by taking 10 square samples (8 cm×8 cm) in the width direction of the product, and calculating the basis mass of them. The lower the CV value, the higher the uniformity of the basis mass.

The solvent-resistant strength was determined by taking samples having a width of 15 mm in MD, immersing the samples in acetone for 10 minutes and immediately measuring the tensile strength thereof with a tensile tester. The higher the solvent-resistant strength, the higher the strength in the prepreg-forming step and the higher the production efficiency of the prepreg even when it is thin.

The ratio of the change in the longitudinal dimension to that in the transverse dimension was determined as follows: A laminate produced from the base material of the present invention was heated at 230° C., which is about the solder reflow temperature, for 10 minutes. Then, the dimension in the longitudinal direction and that in the transverse direction were determined, and they were compared from the dimensions determined prior to the heating to calculate the ratio of the dimensional change in each direction. The ratio of the longitudinal dimensional change to the transverse dimensional change was calculated. As the ratio of the longitudinal dimensional change to the transverse dimensional change is closer to 1, T/Y ratio of the rate of the dimensional change is lower and the accuracy of the copper foil pattern is better in the production of the printed boards.

The warp was also examined by using laminates having a size of 20 cm×20 cm, which were produced in the same manner as that described above. In this test, the results were classified into groups of: "large" (the maximum height of the rise at the four corners was more than 6 mm), "medium" (the maximum height thereof was 2 mm to 6 mm), and "small" (the maximum height thereof was less than 2 mm).

Examples 1 to 9

Paper-making was carried out by using a dispersion (concentration: 0.2 mass %) of para-aramid fibers ("Technora" of Teijin Ltd.; fiber diameter: 12 μm, fiber length: 3 mm) and a paper-making machine, to form a non-woven fabric having a width of 1,000 mm. An aqueous emulsion of epoxy resin (a glass transition point of 150° C.: conc. 6%) was added as the thermosetting resin binder to the non-woven fabric by spray. The non-woven fabric was dried by heating it at 170° to obtain a non-woven fabric sheet. The mass ratio (mass %) of the water-soluble epoxy resin (thermosetting resin binder) to the total mass of the epoxy resin and the para-aramid fibers, and the basis mass of the non-woven fabric sheet are shown in Table 1.

The dry non-woven fabric sheets are laminated. The number of the sheets is shown in Table 1. They were passed through a pair of hot rolls having a temperature of 330° C. and a linear pressure of 200 kg/cm to obtain a base material for a laminate shown in Table 1.

Examples 10 to 11

In Example 10, double-layered, non-woven fabric sheets were produced with a paper-making machine (double layers) under conditions shown in Table 1, and the sheets were dried on the machine in the same manner as Example 1, to form the base material for a laminate.

In Example 11, double-layered, non-woven fabric sheets were produced with a paper-making machine (double layers) under conditions shown in Table 1 and the sheets were dried on the machine. Two of the double-layered, non-woven fabric sheets were laminated and the laminate was passed through the hot rolls and treated in the same manner as Example 1, to form the base material for a laminate.

Comparative Examples 1 to 5

Base materials for a laminate were produced in the same manner as Example 1 except that the conditions were changed as shown in Table 2.

Examples 12 to 15

Base materials for a laminate were produced in the same manner as Example 1 except that the conditions were changed as shown in Table 3.

Comparative Examples 6 and 7

Base materials for a laminate were produced in the same manner as Example 1 except that the conditions were changed as shown in Table 3.

Examples 16 to 22

Base materials for a laminate were produced in the same manner as Example 1 except that the fiber composition of the non-woven fabric sheet was changed as shown in Table 4.

In Table 4, the fibrous binders used are the thermoplastic fibers and the thermosetting fibers. In particular, Conex is meta-aramid fibers (a product of Teijin Limited, fiber diameter: 3 denier; fiber length: 6 mm), Kynol is phenolic resin fibers (a product of Nippon Kynol; fiber diameter: 14 μm, fiber length: 6 mm), and Vectran HS and Vectran NT are both polyarylate fibers (products of Kuraray Co., Ltd.; fiber diameter: 16 μm, fiber length: 6 mm). "Polyphenylene sulfide" is polyphenylene sulfide fibers produced by a melt-spinning method and having a fiber diameter of 3 denier and a fiber length of 5 mm.

In Table 4, Nomex® and Vectran NT in the column of the fibril thermoplastic fibers are m-phenylene isophthalamide fibers (a product of du Pont) and polyarylate fibers (a product of Kuraray Co., Ltd.), respectively, in the form of pulps.

Although the data are not given in this specification, the results similar to those obtained in Examples 1 to 22 were obtained by using base materials for a laminate produced in the same manner as Examples 1 to 22 except that water-soluble acrylic resin or melamine resin was used as the thermosetting resin binder.

Production of Prepregs:

Prepregs were produced by impregnating the base materials for a laminate obtained in Examples 1 to 22 and Comparative Examples 1 to 7 with an epoxy resin varnish of bromobisphenol A type, and then drying them. The amount of the resin thus attached was 50 mass %.

Production of Laminates:

Five plies of the prepregs were laminated and processed by the laminate-molding method by heating them at 170° C. under pressure (4M Pa), to obtain a laminate having a thickness of 0.5 mm.

TABLE 1

| | Example | | | | | | | | | | |
|---|---|---|---|---|---|---|---|---|---|---|---|
| | 1 | 2 | 3 | 4 | 5 | 6 | 7 | 8 | 9 | 10 | 11 |
| Sheet-forming machine used (A: single layer B: double layer) | A | A | A | A | A | A | A | A | A | B | B |
| Basis mass of non-woven fabric sheet (g/m²) | 36 | 36 | 24 | 24 | 24 | 12 | 18 | 12 | 12 | 36 | 18 |
| Number of laminated sheets | 2 | 2 | 3 | 3 | 3 | 6 | 2 | 2 | 2 | 2 | 4 |
| Thermosetting resin binder content (mass %) | 15 | 6 | 15 | 15 | 15 | 15 | 15 | 15 | 6 | 15 | 15 |
| Basis mass weight of base material after lamination with hot roll (g/m²) | 72 | 72 | 72 | 72 | 72 | 72 | 36 | 24 | 24 | 72 | 72 |
| Density of base material after lamination with hot roll (g/cm³) | 0.63 | 0.55 | 0.61 | 0.60 | 0.62 | 0.61 | 0.59 | 0.58 | 0.56 | 0.61 | 0.61 |
| Basis mass CV | 0.70 | 0.68 | 0.47 | 0.61 | 0.55 | 0.37 | 0.64 | 0.63 | 0.66 | 0.69 | 0.44 |
| Degree of warp | slight | slight | slight | slight | slight | slight | slight | slight | slight | slight | slight |
| Torsion | none | none | none | none | none | none | none | none | none | none | none |
| Solvent-resisting strength (kg/15 mm) | 5.9 | 3.4 | 6.2 | 6.1 | 6.2 | 6.1 | 3.4 | 2.5 | 2.2 | 5.9 | 5.8 |

TABLE 2

| | Comparative Example | | | | |
|---|---|---|---|---|---|
| | 1 | 2 | 3 | 4 | 5 |
| Sheet-forming machine used (A: single layer B: double layer) | A | A | A | A | A |
| Basis mass of non-woven fabric (g/m²) | 72 | 24 | 72 | 72 | 24 |
| Number of laminated sheets | 1 | 1 | 1 | 1 | 1 |
| Thermosetting resin binder content (mass %) | 0 | 3 | 15 | 15 | 35 |
| Basis mass of base material after lamination with hot roll (g/m²) | 72 | 24 | 72 | 72 | Base material could not be produced because of stain of hot roll. |
| Density of base material after lamination with hot roll (g/cm³) | 0.52 | 0.53 | 0.59 | 0.59 | |
| Basis mass CV | 2.01 | 1.97 | 0.61 | 1.94 | |
| Degree of warp | Large | large | medium | large | |
| Torsion | Yes | yes | none | yes | |
| Solvent resistance (kg/15 mm) | 2.0 | 0.5 | 5.9 | 5.8 | |

The results of the evaluation obtained in Examples 1 to 11 and Comparative Examples 1 to 5 are shown in Tables 1 and 2. It is clear from these tables that the base materials for a laminate obtained in the present invention are excellent in all the items of the uniformity of the basis mass, uniformity of the rate of the dimensional change and solvent-resistant strength. The laminates obtained from these base materials are free from the torsion.

TABLE 3

| | Example | | | | Comparative Example | |
|---|---|---|---|---|---|---|
| | 12 | 13 | 14 | 15 | 6 | 7 |
| Drying temperature in production of non-woven fabric sheet | 170 | 170 | 140 | 140 | 170 | 170 |
| Heat treatment with hot air before hot roll | none | none | none | yes | none | none |
| Hot roll temperature (° C.) | 210 | 390 | 390 | 390 | 420 | 190 |
| Thermosetting resin binder content mass % | 28 | 28 | 28 | 28 | 28 | 28 |
| Base density g/cm³ | 0.56 | 0.68 | 0.73 | 0.65 | 0.46 | Not laminated |
| Solvent-resistant strength kg/15 mm | 5.7 | 5.8 | 6.1 | 5.7 | 2.0 | |
| Basis mass CV | 0.7 | 0.68 | 0.68 | 0.61 | 0.64 | |
| Degree of warp | slight | slight | slight | slight | slight | |
| Torsion | none | none | none | none | none | |

The results of the evaluation obtained in Examples 12 to 15 and Comparative Examples 6 and 7 are shown in Table 3. It is clear from this table that the base materials for a laminate obtained in the present invention are excellent in all the items of the uniformity of the basis mass, uniformity of the rate of the dimensional change and solvent-resistant strength. The density of each of them could be suitably adjusted within the range.

TABLE 4

| | Material | Ex. 1 | 16 | 17 | 18 | 19 | 20 | 21 | 22 | Comp. Ex. 1 |
|---|---|---|---|---|---|---|---|---|---|---|
| Main fiber | Technora | 100 | 80 | 80 | 80 | 80 | 80 | 92 | 92 | 92 |
| Binder fiber | Conex | | 20 | | | | | | | |
| | Kynol | | | 20 | | | | | | |
| | Vectran HS | | | | 20 | | | | | |
| | Vectran NT | | | | | 20 | | | | |
| | Polyphenylene sulfide | | | | | | 20 | | | |
| Fibril | Nomex | | | | | | | 8 | | |
| thermoplastic fibers | Vectran NT | | | | | | | | 8 | 8 |
| 1) Addition rate of thermosetting resin binder mass % | | 16 | 16 | 16 | 16 | 16 | 16 | 16 | 16 | 0 |
| Solvent-resistant strength kg/15 mm | | 5.9 | 6.9 | 9.5 | 8.2 | 8.1 | 6.5 | 7.1 | 7.3 | 2.0 |
| Basis mass CV | | 0.7 | 0.68 | 0.68 | 0.68 | 0.68 | 0.68 | 0.68 | 0.68 | 2.01 |
| Degree of warp | | slight | slight | slight | slight | slight | slight | slight | slight | large |
| Torsion | | none | none | none | none | none | none | none | none | yes |

The results of the evaluation obtained in Examples 16 to 22 are shown in Table 4. It is clear from this table that the base materials for a laminate obtained in the present invention are excellent in all the items of the uniformity of the basis mass, uniformity of the rate of the dimensional change and solvent-resistant strength. The solvent-resistant strength was further improved by incorporating the thermoplastic fibers and thermosetting fibers described in this specification.

[Effect of the Invention]

As described above, the base material for a laminate of the present invention is suitable for the production of the laminate excellent in all the items of the uniformity of the basis mass, uniformity of the rate of the dimensional change and solvent-resistant strength. The base material is very useful for further reducing the size and weight of electronic appliances and also for further improving the function and reliability of them.

What is claimed is:

1. A process for producing a prepreg comprising the steps of:

(1) preparing a non-woven fabric comprising para-aramid fibers made by a wet type paper-making process;

(2) incorporating a thermosetting resin binder into said non-woven fabric, to prepare a binder-containing non-woven fabric sheet comprising 95 to 70 mass % of the para-aramid fibers and 5 to 30 mass % of the thermosetting resin binder, based on the total mass of the para-aramid fibers and the thermosetting resin binder;

(3) drying said binder-containing non-woven fabric sheet at 140 to 200° C.;

(4) heating a plurality of said binder-containing non-woven fabric sheets together under pressure at a temperature of 30° C. or higher than the drying temperature in step (3) and up to 400° C., so as to integrate said plurality of said binder-containing non-woven fabric sheets, thereby preparing a base material; and (5) impregnating said base material or base materials with a thermosetting varnish and drying the same.

2. The process of claim 1, wherein said base material has a basis mass CV of 0.70 or lower.

3. The process of claim 1, wherein said base material has a basis mass CV of 0.37 to 0.70.

4. The process of claim 1, wherein said non-woven fabric sheet further contains 3 to 300 mass %, based on the total mass of said para-aramid fibers and said thermosetting resin binder, at least one of (a) a thermoplastic resin binder having a softening point of 220° C. or higher and (b) thermosetting resin fibers having a glass transition point of 120° C. or higher.

5. The process of claim 1, wherein the plurality of said binder-containing non-woven fabric sheets are heated at a temperature of 200° C. or higher.

6. The process of claim 1, wherein the heating in step (4) is carried out by a pair of heated rolls.

* * * * *